United States Patent [19]

Mallick, Jr. et al.

[11] Patent Number: 4,704,546

[45] Date of Patent: Nov. 3, 1987

[54] AUCTIONEERING CIRCUIT

[75] Inventors: George T. Mallick, Jr., Penn Hills Township, Allegheny County; William R. Wolfe, Mt. Lebanon; Edward L. Cumberledge, Plum Borough, all of Pa.

[73] Assignee: Westinghouse Electric Corp., Pittsburgh, Pa.

[21] Appl. No.: 893,057

[22] Filed: Jul. 31, 1986

[51] Int. Cl.⁴ .............................................. H03K 5/24
[52] U.S. Cl. .................................... 307/355; 307/351; 307/356; 307/357; 328/117
[58] Field of Search ............... 307/355, 356, 357, 351; 328/117

[56] References Cited

U.S. PATENT DOCUMENTS

| | | |
|---|---|---|
| 3,252,008 | 5/1966 | Vandaveer, Jr. ................... 307/355 |
| 3,590,326 | 6/1971 | Watson . |
| 3,596,107 | 7/1971 | Kittrell ................................ 307/357 |
| 3,634,729 | 1/1972 | Hendry et al. . |
| 3,634,730 | 1/1972 | Wislon . |
| 3,660,722 | 5/1972 | Wilson et al. . |
| 3,689,801 | 9/1972 | Engel et al. . |
| 3,758,867 | 9/1973 | Schulz ................................. 307/357 |
| 4,626,707 | 12/1986 | Arita et al. ......................... 307/355 |

Primary Examiner—John Zazworsky
Attorney, Agent, or Firm—M. J. Moran

[57] ABSTRACT

An auctioneering circuit is provided which utilizes voltage signals that are representative of current signals passing through secondary windings of current transformers. A voltage signal is provided which is representative of the current passing through two or more current transformers. This voltage signal is passed alternatively through a resistive path or an inverting amplifier. Negative portions of the voltage signal are passed through an inverting amplifier to provide a positive signal to the non-inverting input of an operational amplifier. This non-inverting input of the operational amplifier is also connected through a resistive path to the source of the originating volt signal. The input signals to the operational amplifier represent a full wave rectified signal. Three such circuits are connected together at a common connection point and the common connection point is connected to ground through a load resistor across which the maximum of two or more voltage signals can be measured. The circuit operates as an auctioneering circuit using voltage signals.

7 Claims, 9 Drawing Figures

AUCTIONEERING CIRCUIT

BACKGROUND OF THE INVENTION

The present invention relates generally to auctioneering circuits that provide an output signal which is representative of the maximum of two or more electrical currents and, more particularly, to an auctioneering circuit that utilizes operational amplifiers to compare a plurality of voltage signals that are each representative of one of a plurality of alternating currents.

In certain types of electrical control apparatus, it is occasionally beneficial to provide an auctioneering circuit in which the output signal varies with and represents only the largest of a plurality of input currents. Various types of auctioneering circuits are known to those skilled in the art. Some auctioneering circuits first convert input currents to voltage signals which are then compared with other similarly provided voltage signals to provide an output signal which varies only with the maximum of the input currents and is representative of that highest current. Other types of auctioneering circuits provide a comparison of the input currents themselves and do not convert the input current signals to voltage signals prior to the comparison.

U.S. Pat. No. 3,689,801, which issued to Engel et al. on Sept. 5, 1972, describes a circuit breaker that comprises a current auctioneering circuit for obtaining a unidirectional output current that is substantially equal to the unidirectional output current of only one of a plurality of substantially constant, unidirectional current sources which each have a pair of output terminals. U.S. Pat. No. 3,590,326, which issued to Waston on June 29, 1971, discloses an overcurrent protective device of the time delay type which is responsive to the current in an alternating current circuit that is being protected. When an instantaneous current exceeds a predetermined value, the protective device produces an output following a predetermined time delay which may be of fixed duration or which may vary inversely with the magnitude of the current being sensed. U.S. Pat. No. 3,634,729, which issued to Hendry et al. on Jan. 11, 1972, discloses a circuit breaker having separable contacts and an operating means for opening and closing the contacts. This circuit breaker includes an overcurrent protective device that is responsive to the current in the separable contacts. U.S. Pat. No. 3,660,722, which issued to Wilson et al. on May 2, 1972, discloses a circuit breaker in which a current transformer is arranged to provide the energy or power necessary for the output of the device and also to provide a first signal which varies with the ground current in the system. Other means is provided to derive a second signal from the associated system which varies with the line current in the system for which the highest line current in the system with said protective device is arranged to respond to both of the signals. U.S. Pat. No. 3,611,037, which issued to Watson on Oct. 5, 1971, describes a protective relay device for detecting ground faults in a polyphase alternating current system. It produces an output when the ground current in the system being protected increases above a predetermined level. U.S. Pat. No. 3,634,730, which issued to Wilson on Jan. 11, 1972, discloses a circuit breaker comprising an overcurrent protective device which includes means that are responsive to the current in separable contacts and in an electrical circuit which is being protected. The circuit breaker is tripped when predetermined operating conditions occur.

SUMMARY OF THE INVENTION

The present invention provides a circuit in which two or more inputs are connected individually to sources of alternating currents. In a preferred embodiment of the present invention, each of the inputs comprises a current transformer combined with a resistor that is connected between the termini of the secondary winding of the current transformer. This combination provides a voltage signal that is representative of an associated alternating current passing through the resistor and, in a typical application, the voltage signal has alternating positive and negative portions. The present invention provides a means for inverting the negative portions of the voltage signals with an output of this inverting means being connected in electrical communication with a first connection point, or node, of the circuit of the present invention. In a preferred embodiment of the present invention, this inverting means is an operational amplifier with its inverting input connected in electrical communication with the resistor which is connected between the termini of its associated current transformer. The non-inverting input of this operational amplifier is connected to ground.

Positive portions of the representative voltage signal are transmitted to the connection point, or node, of the circuit. In a preferred embodiment of the present invention, a pair of resistors is used to provide a signal termini of the current transformer and the connection point, or node, of the circuit. As will be described in greater detail below, the positive and negative portions of the representative voltage signal travel in parallel paths, the negative portion of the representative voltage signal passing through the operational amplifier which inverts it and the positive portion of the representative voltage signal passing through a portion of the present invention that is connected in parallel with the inverting operational amplifier.

The present invention also provides a means for preventing an electrical current from passing from the connection point, or node, of the circuit in a direction toward the current transformer. In a preferred embodiment of the present invention, this preventing means is provided by an operational amplifier and a diode. The operational amplifier is utilized as a buffer amplifier with a negative feedback connected around the diode.

With two or more such circuits connected between associated current sources and the connection point, the present invention provides a voltage signal at the connection point that is representative of the maximum of the input currents. By connecting a load resistor between the connection point and ground, the voltage at the connection point can be measured and this measured value represents the magnitude of the maximum of the input currents.

BRIEF DESCRIPTION OF THE DRAWING

The present invention will be more completely understood from a reading of the Description of the Preferred Embodiment in conjunction with the drawing, in which.

DESCRIPTION OF THE PREFERRED EMBODIMENT

Figure 1:
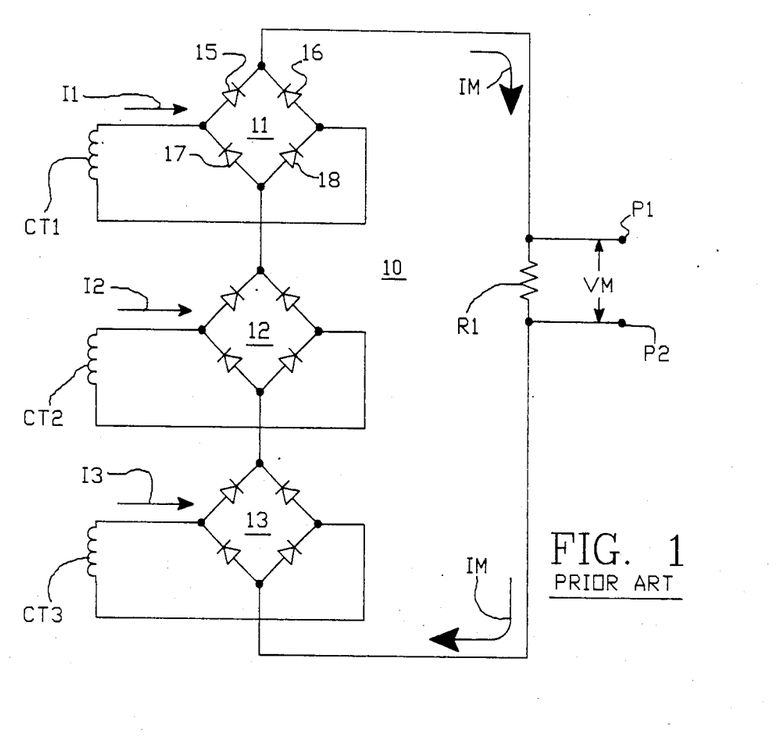
FIG. 1 illustrates a known auctioneering circuit.

FIG. 1 illustrates a known circuit for obtaining a unidirectional output current which is substantially equal to the unidirectional output current of only one of a plurality of current sources which each has a pair of output terminals. The circuit illustrated in FIG. 1 is described in detail in U.S. Pat. No. 3,689,801 which issued to Engel et al. on Sept. 5, 1972. This circuit utilizes three current transformers, CT1, CT2 and CT3, as its inputs. Each of these input current transformers would typically have as its primary winding a conductor whose current is to be monitored. For example, the circuit illustrated in FIG. 1 could be utilized as part of a circuit breaker which is intended to react to the maximum of three currents wherein each of the three currents passes through, as a primary winding, a corresponding one of the illustrated current transformers. Each of the current transformers is connected to a full wave rectifier. For example, current transformer CT1 is connected to full wave rectifier 11 which comprises four diodes, 15, 16, 17 and 18, connected as shown.

For purposes of illustration, it will be assumed that each of the secondaries of the current transformers has an alternating current passing through it that is representative of its respective primary current that each of the secondary currents, 11, 12 and 13, have different magnitudes with 11 being the highest current. The three full wave rectifier circuits, 11, 12 and 13, are connected in series as shown in FIG. 1. Also connected in series with the rectifying circuits is a load R1 which represents an impedance across which a voltage potential can be measured. The measured output current IM passes through the load R1 and a measured voltage VM can be determined by measuring the voltage potential between points P1 and P2.

Figure 2:
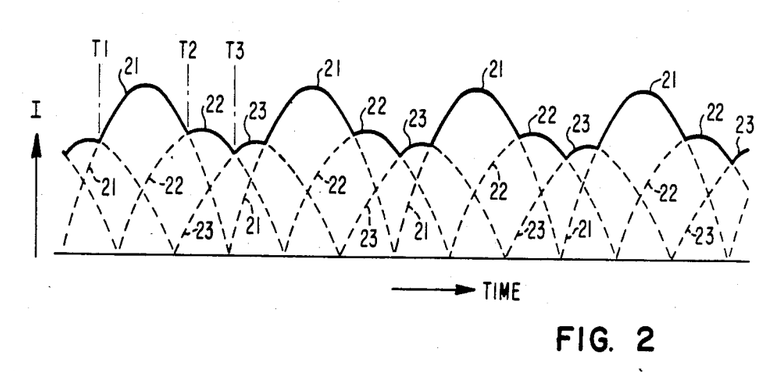
FIG. 2 illustrates the current signal provided as an output by the auctioneering circuit shown in FIG. 1.

As an illustration, if current 11 is greater than either of the other currents, 12 or 13, it will pass from the full wave rectifier circuit 11, through the load R1 and toward the full wave rectifier circuit 13 that is associated with current transformer CT3. As fully described in U.S. Pat. No. 3,689,801, the highest of the three currents (i.e. 11 in this example) passes through the full wave rectifying circuits of the other two phases without having its magnitude affected by the other two currents, 12 or 13. Of course, it must be realized that the three secondary currents, 11, 12 and 13, are alternating currents and are constantly varying in their magnitudes. Therefore, as the magnitude of each of these input currents changes, the identity of the highest instantaneous current will likely change. This concept is illustrated in FIG. 2. The rectified waveforms of currents 11, 12 and 13 of FIG. 1 are illustrated in FIG. 2. Waveform 21 represents the rectified waveform of current 11, waveform 22 represents the rectified waveform of current 12 and waveform 23 represents the rectified waveform of current 13. As can be seen in FIG. 2, each of the three current waveforms varies from zero to some peak value. Furthermore, it should be noted that in FIG. 2 the three waveforms are also illustrated as being 120° out of phase with each other as would normally occur in a three-phase circuit. For purposes of illustration, waveform 21 is shown as being the largest of the three current waveforms with waveform 23 being the smallest. As can be seen in the illustration of FIG. 2, the highest instantaneous value of these three current waveforms varies over time. For example, between times T1 and T2, the instantaneous magnitude of current waveform 21 is higher than the instantaneous value of either of the other two waveforms. Then, from time T2 to time T3, current waveform 22 has the highest instantaneous value of the three waveforms. Similarly, between time T3 and T4, current waveform 23 has the highest instantaneous magnitude. The solid line shown in FIG. 2 represents the maximum instantaneous magnitude of the three input currents over time. As described in U.S. Pat. No. 3,689,801, the output of the auctioneering circuit illustrated in FIG. 1 would be a measurable current IM that is represented by the solid line in FIG. 2. Therefore, a measuring device can monitor the voltage potential between points P1 and P2 to determine the magnitude of the maximum of the three input currents. If employed as part of a circuit breaker, the voltage potential between points P1 and P2 can be used to break an electrical circuit when the magnitude of the highest of the three secondary currents, 11, 12 or 13, exceeds a preselected threshold value.

Auctioneering circuits such as that illustrated in FIG. 1 are known to those skilled in the art and have been used for many years to extract information concerning the magnitude of currents in two or more phases of an electrical circuit. The circuit illustrated in FIG. 1 causes a voltage to appear across a load resistor R1 that is proportional to the magnitude of the largest phase current. The largest of the three monitored currents prevails and displaces lower values of the other phases. One disadvantage of the auctioneering circuit illustrated in FIG. 1 is that the diode bridges, 11, 12 and 13, require a forward voltage of approximately 3.5 volts before current will flow through them. As is known to those skilled in the art, silicon diodes exhibit a voltage drop of approximately 0.6 volts and germanium diodes exhibit a voltage drop of approximately 0.25 volts. This provides a non-linear load that can seriously impair the performance of the current transformers, CT1, CT2 and CT3, at low magnitudes of current passing through their respective primaries. This problem can occur when the current passing through the secondary windings of the current transformers is not of sufficient magnitude to provide a voltage output on the secondary windings of the current transformer that is able to overcome this forward voltage of the diodes. This characteristic limits the dynamic range over which the auctioneering circuit can be properly used.

Figure 3:
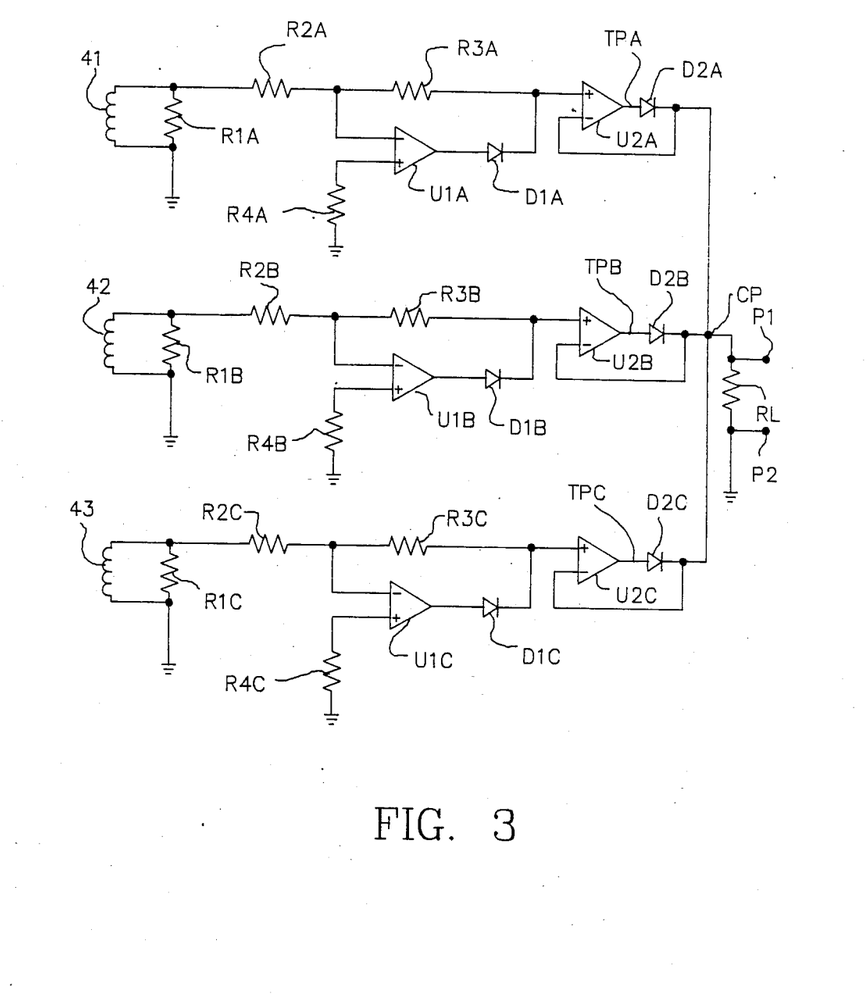
FIG. 3 illustrates the preferred embodiment of the present invention.

A preferred embodiment of the present invention is illustrated in FIG. 3. It provides a circuit that enables the use of current transformers that exhibit a very wide dynamic range. It accomplishes the auctioneering function by using operational amplifiers in an active circuit configuration. The burden on the current transformer can therefore be kept linear, constant and of a sufficiently low value to accommodate a much wider range of input currents being measured. It permits the current transformers to utilize a wider range of their magnetic properties, thus significantly extending the useful range of the circuit.

As illustrated in FIG. 3, the present invention would typically be utilized to accommodate a three-phase system in which each of the three phases is monitored and the highest current of the three phases is used to determine the effective maximum current in the three phase system. The current transformers, 41, 42 and 43, are each connected to a resistor such as resistors R1A, R1B and R1C respectively. A suitable current transformer is described in patent application Ser. No. 860,711, which was filed on May 7, 1986 by Wolfe et al. and assigned to the assignee of the present application. However it should be understood that any one of many alternative types of current transformers could be utilized to provide a current signal that is representative of a current flowing through the primary of the current transformer.

The present invention, as illustrated in FIG. 3, will be described with specific reference to the particular components that are associated with current transformers 41 and resistor R1A. As can be seen from FIG. 3, the components of the other two phases are essentially identical to the components in the first phase and serve a functionally similar purpose. As described above, current transformer 41 is connected to resistor R1A. Resistor R1A provides a constant low value of burden for the current transformer 41 so that it can remain in a linear region of its performance profile. If the current transformer 41 would be permitted to saturate its core, it would cease to become linear. Therefore, it is important for the proper operation of the present invention that resistor R1A be of a fairly low value, such as approximately 10 ohms. Since the resistance in the secondary winding of the transformer 41 would normally be expected to exhibit a resistance of approximately 15 ohms, this magnitude of resistance of resistor R1A would permit current to flow freely in the current transformer winding of current transformer 41.

Resistor R4A is used in this preferred embodiment of the present invention to minimize the affects of bias currents in the operational amplifier input circuit. However, it should be understood that, as it relates to the operation of the present invention, resistor R4A could be of an extremely low resistance value and, under certain circumstances, it could be envisioned that the value of resistance R4A could be zero and the non-inverting input of operational amplifier U1A could effectively be connected directly to ground, Resistors R2A and R3A are intended, in a preferred embodiment of the present invention, to be of equal value so that the gain of amplifier U1A is essentially unity. Under these conditions, operational amplifier U1A is an inverting amplifier for negative portions of the current waveform passing through resistor R1A. During positive portions of the current waveform, passing through resistor R1A, a positive voltage signal exists at the non-inverting input of operational amplifier U2A. Therefore, the non-inverting input of operational amplifier U2A senses the positive voltage signals that are representative of the current signal passing through resistor R1A. Negative portions of this voltage signal are inverted by operational amplifier U1A and positive portions of this voltage signal are sensed through resistors R2A and R3A.

For example, if a negative voltage is developed across resistor R1A, the operational amplifier U1A inverts this negative signal that is received at its inverting input and a positive voltage signal would be developed at the cathode of diode D1A and the non-inverting input of operational amplifier U2A. The output of operational amplifier U2A would be an equivalent positive voltage because the operational amplifier U2A would operate as a buffer amplifier, or a voltage follower, to provide a high input impedance for operational amplifier U1A. The function of diode D2A is to prevent reverse currents passing from the connection point CP toward the current transformer 41 through resistors R2A and R3A. With operational amplifier U2A in the circuit as illustrated in FIG. 3, a complete blockage is provided for these types of reverse currents passing from connection point CP. These reverse currents could typically occur during the positive excursions of the voltage across resistor R1A. The diode D1A effectively disconnects U1A during this time and allows the positive voltage developed across resistor R1A to be directly impressed, through resistors R2A and R3A, on the buffer amplifier U2A.

Operational amplifier U2A and diode D2A combine to provide a voltage signal output from diode D2A that is equal to the input signal at the non-inverting input of operational amplifier U2A. By connecting the cathode of diode D2A to the inverting input of operational amplifier U2A, a negative feedback is provided that reduces the effect of the voltage drop across diode D2A to a value that is infinitesimally small compared to what its value would be if operational amplifier U2A was absent from the circuit. The voltage drop across diode D2A is compensated for by the gain of operational amplifier U2A so that this output is adjusted automatically to provide for a very low voltage drop across the combination of operational amplifier U2A and diode D2A. Operational amplifier U2A operates to establish a zero voltage difference between its inverting and non-inverting inputs.

As can be seen from FIG. 3 and the discussion above, resistors R1A, R2A and R3A, in combination with operational amplifiers U1A and U2A and diodes D1A and D2A, operate to provide a full wave rectifier. Negative portions of the voltage signal sensed at resistor R1A are inverted by operational amplifier U1A and diode D1A and provided as an input to the non-inverting input of operational amplifier U2A. For example, if the voltage drop across resistor R1A was −1 volt, the output from the cathode of diode D1A would be a +1 volt. This +1 volt would also be sensed at the non-inverting input of operational amplifier U2A. In actual operation, diode D1A would exhibit approximately one-half of one volt drop across it, but the effect of the voltage drop across diode D1A is minimized by the gain of the operational amplifier U1A. As is well known by those skilled in the art of operational amplifier applications. The voltage drop across diodes D1A and D2A is approximately 0.6 volts. When the sign of the current signal passing through resistor R1A is reversed, and a +1 volt drop exists across resistor R1A, the inverting input of operational amplifier U1A will be positive. This causes a negative voltage to appear at the output of operational amplifier U1A. This reverse biases the diode D1A, effectively opening that portion of the circuit, and operational amplifier U1A becomes ineffective in the circuit. Therefore, during positive portions of the voltage signal across resistor R1A, the voltage is sensed directly by the non-inverting input of operational amplifier U2A through resistors R2A and R3A. The voltage drop across resistors R2A and R3A is essentially negligible because of the high impedance provided by the buffer amplifier, such as operational amplifier U2A, which is significantly greater than the resistive values of resistors R2A and R3A. For example, in a typical application of the present invention, the impedance of the buffer amplifier U2A would be greater than one megohms and the resistance of resistors R2A and R3A would be approximately 10,000 ohms. Therefore, very little voltage is developed across resistors R2A and R3A and their effect on the voltage signal is significantly minimized.

The components connected in association with current transformers 42 and 43 are essentially identical to those described above in association with current transformer 41. As shown in FIG. 3, the inverting inputs of operational amplifiers U2A, U2B and U2C are connected together at the connection point CP. In operation, the highest of the three voltages sensed across resistors R1A, R1B and R1C exists at connection point CP. Therefore, if a load resistor RL is connected between the connection point CP and ground, a voltage potential measured between points P1 and P2 would be indicative of the highest of the three voltages sensed across resistors R1A, R1B and R1C and would be representative of the highest of the currents flowing through the secondary windings of current transformers 41, 42 and 43.

The three portions of the present invention shown in FIG. 3 will now be described in the manner that they cooperate together for the purpose of providing a voltage signal at connection point CP that is representative of the highest of the three currents flowing through the secondary windings of the current transformers 41, 42 and 43. For purposes of this discussion, it will be assumed that the current through the secondary of current transformer 41 is higher than those currents flowing through the secondaries of current transformer 42 and 43 and, furthermore, that the voltage across resistor R1A under these circumstances is 1 volt. As described above, either a $-1$ volt potential or a $+1$ volt potential across resistor R1A will provide a $+1$ volt signal at the cathode of diode D2A. At the precise instant in time when the instantaneous value of the voltage across resistor R1A is 1 volt, it will be further assumed that the voltage across resistor R1B is $\frac{3}{4}$ of a volt. As discussed above, the normal output that would be expected from operational amplifier U2B and diode D2B would be $+\frac{3}{4}$ of a volt. The 1 volt signal that is output from operational amplifier U2A and diode D2A would appear at connection point CP and at the inverting input of operational amplifier U2B since the inverting input of operational amplifier U2B is connected directly to connection point CP. Under these assumed conditions, the voltage at the inverting input of operational amplifier U2B would be 1 volt and the voltage at the non-inverting input of operational amplifier U2B would be approximately $\frac{3}{4}$ of a volt. Therefore, the output of operational amplifier U2B would tend to be negative and since operational amplifier U2B is provided with a negative feedback circuit, diode D2B would be reverse biased and no closed path would be provided for this feedback to be effective. Therefore, operational amplifier U2B would operate in a non-linear manner and its output would be expected to go to the full negative supply value of approximately $-15$ volts. This presents no significant problem because of the fact that, due to its reverse biasing, diode D2B effectively disconnects the components associated with current transformer 42 from connection point CP. In summary, the highest of the voltage signals being output by the operational amplifiers U2A, U2B and U2C, effectively disconnects the other two circuits from connection point CP. This condition would exist as long as the connected circuit has the highest voltage value being output by the buffer amplifiers. Of course, it should be understood that when another one of the current transformers achieves a current whose absolute value is greater than the current transformer presently connected in signal communication with connection point CP, conditions would change automatically and the current transformer with the highest instantaneous secondary current would control the circuit illustrated in FIG. 3 and its associated operational amplifier (e.g. operational amplifiers U2A, U2B or U2C) would output a voltage representing the magnitude of its associated current transformer and control the voltage at the connection point CP. Each of the other two operational amplifiers would be driven to its maximum negative value of approximately $-15$ volts and be effectively disconnected from the connection point CP by its associated diode (e.g. diodes D2A, D2B or D2C).

Figure 4A:
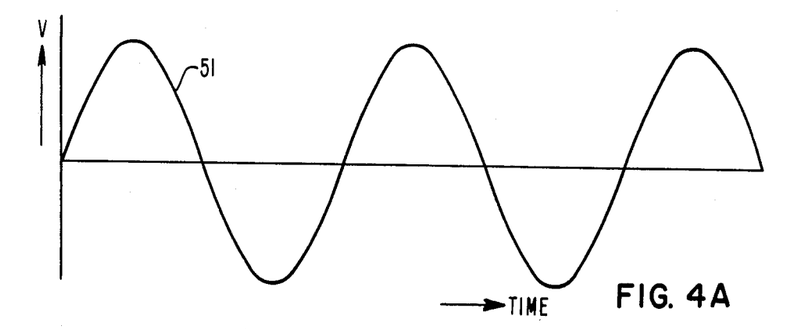
FIG. 4A shows the voltage signal that is representative of an alternating current and used as an input to the present invention.
Figure 4B:
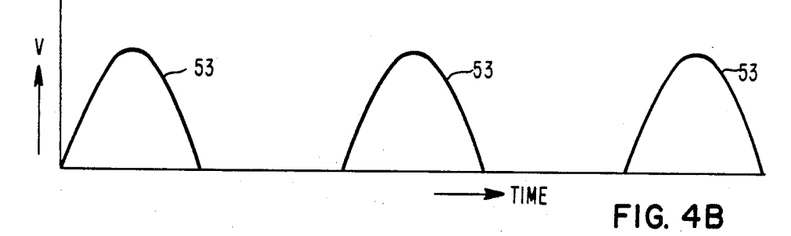
FIG. 4B shows the positive portions of the representative voltage illustrated in FIG. 4A.
Figure 4C:
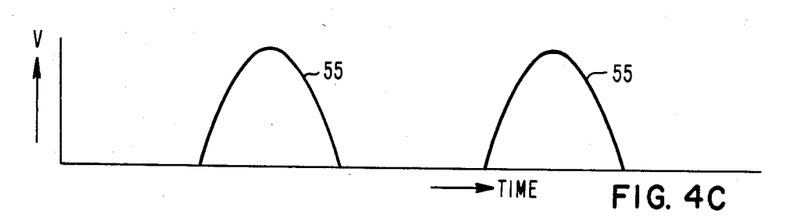
FIG. 4C illustrates inverted negative portions of the representative voltage signal illustrated in FIG. 4A.
Figure 4D:
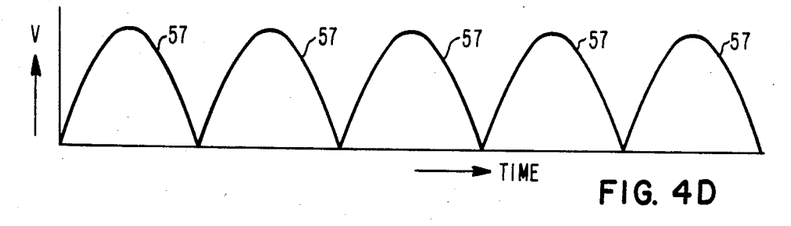
FIG. 4D illustrates the combination of the signals illustrated in FIGS. 4B and 4C.

To further explain the operation of the present invention illustrated in FIG. 3, reference will be made to the waveforms in FIGS. 4A, 4B, 4C and 4D. The waveform in FIG. 4A represents the voltage waveform that would be sensed across resistors R1A, R1B or R1C. Using the portion of the circuit illustrated in FIG. 3 which is associated with current transformer 41, the waveform in FIG. 4A would represent the voltage signal sensed across resistor R1A that is representative of the alternating current passing through the secondary of current transformer 41. As can be seen, the waveform 51 has both positive and negative portions. The positive portions of waveform 51 are illustrated in FIG. 4B. These positive portions 53 of waveform 51 would be sensed at the non-inverting input of operational amplifier U2A through resistors R2A and R3A. As described above, the impedance of operational amplifier U2A is extremely high relative to the resistance of the resistors R2A and R3A and, therefore, the current passing through resistors R2A and R3A is so small that the voltage sensed at the non-inverting input of operational amplifier U2A is essentially the same as that positive portion 53 of waveform 51 that exists at resistor R1A. FIG. 4C illustrates the negative portion 53 of the waveform 51 that passes to the inverting input of operational amplifier U1A. As discussed above, operational amplifier U1A operates as an inverting amplifier for negative portions of the voltage signal across resistor R1A. FIG. 4D illustrates the combination of the positive 53 and negative 55 portions of the voltage signal across resistor R1A. In FIG. 4D, this combined rectified signal 57 would be sensed at the non-inverting input of operational amplifier U2A.

Figure 5A:
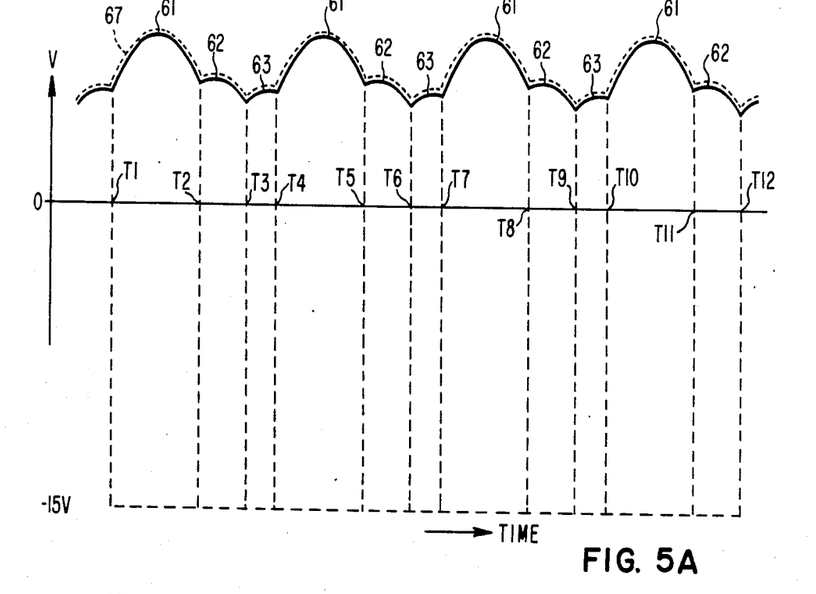
FIG. 5A illustrates an output signal of the present invention.

Since the current signals passing through the secondaries of current transformers 41, 42 and 43 are alternating from positive to negative values, their respective voltage values across resistors R1A, R1B and R1C will also vary from positive to negative values. With this in mind, it can be assumed that the voltage at the connection point CP will vary in accordance with the instantaneous maximum absolute value of the three secondary currents. Furthermore, as the voltage output from diodes D2A, D2B and D2C vary, each of the phases of the circuit illustrated in FIG. 3 will, at one time or another, achieve a value that is higher than the other two phases. This concept is illustrated in FIG. 5A. The time-based curve of FIG. 5A illustrates the output voltages at the cathodes of the three diodes, D2A, D2B and D2C. As illustrated in FIG. 5A, the voltage output 61 from diode D2A is higher than the associated voltage outputs from diodes D2B and D2C. This situation exists between times T1 and T2. Then, beginning at time T2, the voltage waveform 62 that is output from diode D2B surpasses the instantaneous magnitude of waveform 61 and becomes the maximum of the three outputs. It must be understood that waveforms 61, 62 and 63 are portions of the rectified waveforms that are sensed at the non-inverting inputs of operational amplifiers U2A, U2B and U2C. At time T2, waveform 61 is falling and waveform 62, although achieving a smaller peak value than waveform 61, surpasses the instantaneous magnitude of waveform 61. At time T2, waveform 63 is still less than waveform 62 even though it is beginning to rise. As can be seen, waveform 62, which is associated with diode D2B, is the highest of the three waveforms until time T3 when waveform 63, which is associated with diode D2C, surpasses it. Therefore, as shown in FIG. 5A, each of the three waveforms that are output from diode D2A, D2B and D2C are the maximum value for a portion of the time illustrated in FIG. 5A. In a typical condition in which the present invention is applicable, the current transformers 41, 42 and 43 would conduct alternating currents that are 120° out of phase with respect to each other. Under these conditions, the three waveforms represented in FIG. 5A would also be 120° out of phase with each other. Therefore, it is likely that each of the waveforms would achieve an instantaneous value at some point during its cycle that is higher than the other two waveforms. The solid line illustrated in FIG. 5A represents the combination of each of the waveforms during the periods of time when those waveforms were the highest instantaneous value of the three signals.

As discussed above, diodes D2A, D2B and D2C cause a slight voltage drop across them. Therefore, the actual output of the operational amplifiers U2A, U2B and U2C are slightly higher than the voltage magnitude at the cathodes of their associated diodes or at connection point CP. Referring to FIGS. 3 and 5A, the solid line which comprises waveforms, 61, 62 and 63, represents the voltage magnitude at the cathodes of diodes D2A, D2B and D2C at various points along a time line. The composite waveform illustrated by the solid line in FIG. 5A represents the voltage at the connection point CP. The dashed line 67 shown in FIG. 5A represents the voltages at teh outputs of the operational amplifiers U2A, U2B and U2C that would be sensed at test points TPA, TPB and TPC at the times when the respective operational amplifiers are associated with the highest magnitude of secondary current in the circuit illustrated in FIG. 3. The voltage magnitude difference between the dashed lines 67 and the solid line that comprises waveforms 61, 62 and 63 in FIG. 5A represents the voltage drop across the diodes. The difference in voltage magnitude between the solid line in FIG. 5A and the dashed line 67 is caused by the negative feed-back feature of the buffer amplifiers illustrated in FIG. 3. As described above, this negative feed-back characteristic is achieved by connecting the inverting inputs of the buffer amplifiers to the connection point CP.

Figure 5B:
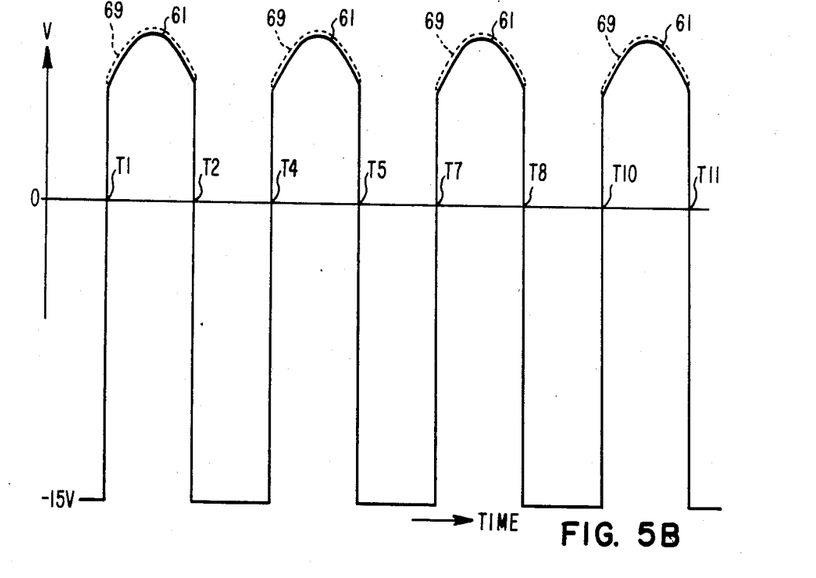
FIG. 5B illustrates the portion of the output signal of FIG. 5A that is contributed by one of three input currents connected as inputs to the present invention.

In FIG. 5A, the dashed lines passing through the time line at times T1, T2, T3, etc. represent not only the instant of time when there is a change of the particular signal (e.g. 61, 62 or 63) that is maximum at any specific period of time, but also represent the magnitude of each voltage signal as it passes from some positive value to a value of −15 volts. FIG. 5B represents one of the three signals shown in FIG. 5A (i.e. waveform 61). As can be seen in FIG. 5B, waveform 61 periodically varies from some positive value to a −15 volts which represents the magnitude of the negative supply voltage for the buffer amplifier U2A related to the signal. As described above, waveform 61 is the maximum instantaneous value of the three waveforms from time period T1 to time period T2, time period 4 to time period 5, time period 7 to time period 8 and time period 10 to time period 11. When waveform 61 ceases to be the maximum instantaneous value of the three waveforms, at time period T2, the magnitude of the signal at the output of its buffer amplifier and diode (e.g. operational amplifier U2A and diode D2A) drops from its positive value to a value of −15 volts. The waveform illustrated in FIG. 5B relates to the behaviour described above in conjunction with FIG. 3 in which another one of the phases provides a voltage at the connection point CP that is higher than the voltage at the cathode of the diode associated with the source of signal 61. For example, if waveform 61 represents the signal at the cathode of diode D2A of phase A in FIG. 3, time T2 represents the time at which the signal that is output from the cathode of diode D2B achieves an instantaneous value higher than the value that is being output from the cathode of diode D2A. When this occurs, diode D2A is reverse biased and essentially disconnects operational amplifier U2A from connection point CP. This causes operational amplifier U2A to output a negative voltage signal representative of its maximum negative value, such as −15 volts. For illustrative purposes, dashed line 69 is also shown in FIG. 5B to illustrate the fact that the output from the buffer amplifier U2A is slightly higher than the output of the cathode of diode D2A during periods of time when phase A represents the highest voltage signal of the three phases illustrated in FIG. 3. The difference in voltage magnitude between waveform 61 and waveform 69 is equal to the voltage drop across diode D2A.

Referring again to FIG. 3, it can be seen that the present invention provides a voltage signal at the connection point CP which is representative of the maximum current flowing through the secondary windings of the current transformers 41, 42 and 43. This voltage signal at the connection point CP enables the connection point CP to be connected to ground, through a load resistor RL, where it can be measured between points P1 and P2 to arrive at a signal level that is representative of the highest current in a three-phase system.

The present invention provides a circuit which functions as a full wave rectifying circuit that is able to operate at very low levels of current signal inputs and remain in a linear mode of operation. These characteristics provide the present invention with a very wide dynamic range. Furthermore, the present invention can be made using readily available operational amplifiers. The impedances of the components in an auctioneering circuit provided by the present invention are sufficiently high to limit current flowing through them to a neglible value compared to the current flowing through the load resistor RL. Therefore, the segments of the present invention associated with non-maximum current signals do not substantially influence the accuracy produced by the segment of the present invention associated with the maximum current signal at any specific instant in time. In other words, phase A does not significantly load phase B and phase C when phase B and phase C are at lower values than phase A. The load resistance in a preferred embodiment of the present invention would typically be between 1,000 ohms and 10,000 ohms. The input impedance of an operational amplifier, even when it is being operated in a non-linear region, would be expected to be considerably greater than 100,000 ohms and perhaps as high as 10 megahms or more. It should be understood that the specific values of the components disclosed and illustrated in the present application can vary for different specific applications of the present invention. However, typical values of these components are illustrated in Table I.

TABLE I

| Reference Numeral | Value Range or Composition Type |
|---|---|
| R1A, R1B, R1C | 10 Ω |
| R2A, R2B, R2C | 10K Ω |
| R3A, R3B, R3C | 10K Ω |
| R4A, R4B, R4C | 5K Ω-0 Ω |
| RL | 1K Ω |
| D1A, D1B, D1C | 1N4148 |
| D2A, D2B, D2C | 1N4148 |
| U1A, U1B, U1C | 741 Operational Amplifier |
| U2A, U2B, U2C | 741 Operational Amplifier |

Although the present invention has been described in significant detail and with reference to particular components, it should be understood that alternative configurations and component selection are to be considered within the scope of the present invention.

What is claimed is:

1. A circuit for determining the maximum of two variable electrical currents, comprising:
    a first burden having first and second external terminals and an intermediate terminal, said first external terminal of said first burden being connected to one side of a first current related voltage source for a first of said two electrical currents;
    a first operational amplifier having an inverting input electrically connected to said intermediate terminal of said first burden, said first operational amplifier having a noninverting input electrically connected in circuit relationship to a second side of said first current related voltage source, said first operational amplifier having an output electrically connected to said second external terminal of said first burden through a first diode, said first diode having its anode electrically connected to said output of said first operational amplifier;
    a second operational amplifier having a noninverting input electrically connected to the cathode of said first diode, said second operational amplifier having an output electrically connected to an anode of a second diode, said second diode having a cathode connected to a common point, said common point being connected to a first side of a second burden, a second side of said second burden being electrically connected to ground, positive values of the voltage of said first current related voltage source being supplied through said first burden to noninverting input of said second operational amplifier, negative values of said first current related voltage source causing the combination of said first burden and said first operational amplifier to cooperate as a gain-of-one inverter, said negative values thus being inverted and impressed across said noninverting input of said second operational amplifier with the same polarity as said positive value of said voltage;
    a third burden having first and second external input terminals and an intermediate terminal, said first external terminal of said third burden being connected to one side of a second current related voltage source for a second of said two electrical currents;
    a third operational amplifier having an inverting input electrically connected to said intermediate terminal of said third burden, said third operational amplifier having a noninverting input electrically connected in circuit relationship to a second side of said second current related voltage source, said third operational amplifier having an output electrically connected to said second external terminal of said third burden through a third diode, said third diode having its anode electrically connected to said output of said third operational amplifier;
    a fourth operational amplifier having a noninverting input electrically connected to the cathode of said third diode, said fourth operational amplifier having an output electrically connected to an anode of a fourth diode, said fourth diode having a cathode connected to said common point, positive values of the voltage of said second current related voltage source being supplied through said third burden to said noninverting input of said third operational amplifier, negative values of said second current related voltage source causing the combination of said third burden and said third operational amplifier to cooperate as a gain-of-one inverter, said negative values thus being inverted and impressed across said noninverting input of said fourth operational amplifier with the same polarity as said positive value of said voltage; and
    said second burden having a current passing therethrough that is representative of said maximum of said two variable electrical currents.

2. A circuit for obtaining an output signal representative of the maximum of two variable electrical current, comprising:
    first providing means for providing a first voltage signal having positive and negative portions that is representative of a first one of said two variable electrical current;
    first inverting means for inverting said negative portions of said first voltage signal, an output of said first inverting means being electrically connected to a connection point;
    first transmitting means for transmitting said positive portions of said first voltage signal from said first providing means to said connection point;
    first preventing means for preventing an electrical current from flowing from said connection point to said first providing means;
    second providing means for providing a second voltage signal having positive and negative portions that is representative of a second one of said two variable electrical currents;
    second inverting means for inverting said negative portions of said second voltage signal, an output of said second inverting means being electrically connected to said connection point;

second transmitting means for transmitting said positive portions of said second voltage signal from said second providing means to said connection point; and second preventing means for an electrical current from flowing from said connection point to said second providing means.

3. The circuit of claim 2, further comprising:

a burden electrically connected between said connection point and electrical ground.

4. The circuit of claim 2, wherein:

said first providing means comprises a first current transformer and a first resistor; and said second providing means comprises a second current transformer and a second resistor.

5. The circuit of claim 2, wherein:

said first inverting means comprises a first inverting operational amplifier; and said second inverting means comprises a second inverting operational amplifier.

6. The circuit of claim 2, wherein:

said first transmitting means comprises a first pair of resistors; and said second transmitting means comprises a second pair of resistors.

7. The circuit of claim 2, wherein:

said first preventing means comprises a first operational amplifier and a first diode; and said second preventing means comprises a second operational amplifier and a second diode.

* * * * *